United States Patent [19]

Shinozaki et al.

[11] Patent Number: 5,699,302

[45] Date of Patent: Dec. 16, 1997

[54] MODE REGISTER CONTROL CIRCUIT AND SEMICONDUCTOR DEVICE HAVING THE SAME

[75] Inventors: Naoharu Shinozaki; Tatsuya Kanda, both of Kawasaki, Japan

[73] Assignee: Fujitsu Limited, Kanagawa, Japan

[21] Appl. No.: 715,701

[22] Filed: Sep. 19, 1996

[30] Foreign Application Priority Data

Mar. 19, 1996 [JP] Japan .................................. 8-063536

[51] Int. Cl.⁶ .................................................. G11C 7/00
[52] U.S. Cl. ............................... 365/189.05; 365/189.01
[58] Field of Search ...................... 365/189.01, 189.05, 365/191, 233, 230.01

[56] References Cited

U.S. PATENT DOCUMENTS

| | | |
|---|---|---|
| 5,526,320 | 6/1996 | Zagar ............................. 365/233.5 |
| 5,532,961 | 7/1996 | Mori ............................. 365/189.05 |
| 5,566,108 | 10/1996 | Kitamura ............................. 356/233 |
| 5,598,376 | 1/1997 | Merritt ............................. 365/230.06 |

*Primary Examiner*—David C. Nelms
*Assistant Examiner*—Son Mai
*Attorney, Agent, or Firm*—Nikaido Marmelstein Murray & Oram LLP

[57] ABSTRACT

A mode register control, circuit for a semiconductor device includes a first control unit for preventing the content of a mode register from being read, using an initializing signal for instructing latching circuits to be initialized, the initialization being done in a transient occurring after the semiconductor device is turned on; a second control unit for instructing the mode register to execute a mode register read command even if a mode register set command has not been executed, on the condition that an external command other than the mode register read command is detected when the semiconductor device is turned on; or a third control unit for instructing the mode register to execute the mode register read command on the condition that the mode register set command is executed after the semiconductor device is turned on.

6 Claims, 4 Drawing Sheets

MODE REGISTER CONTROL CIRCUIT AND SEMICONDUCTOR DEVICE HAVING THE SAME

BACKGROUND OF THE INVENTION

1. Field of the Invention

The present invention relates to mode register control circuit for controlling a semiconductor memory, and more particularly to a mode register control circuit for controlling a synchronous dynamic RAM (SDRAM), a type of high-band dynamic RAM (high-band DRAM) capable of achieving a data transfer speed of, for example, 100 Mbyte/sec.

2. Description of the Related Art

Figure 1A:
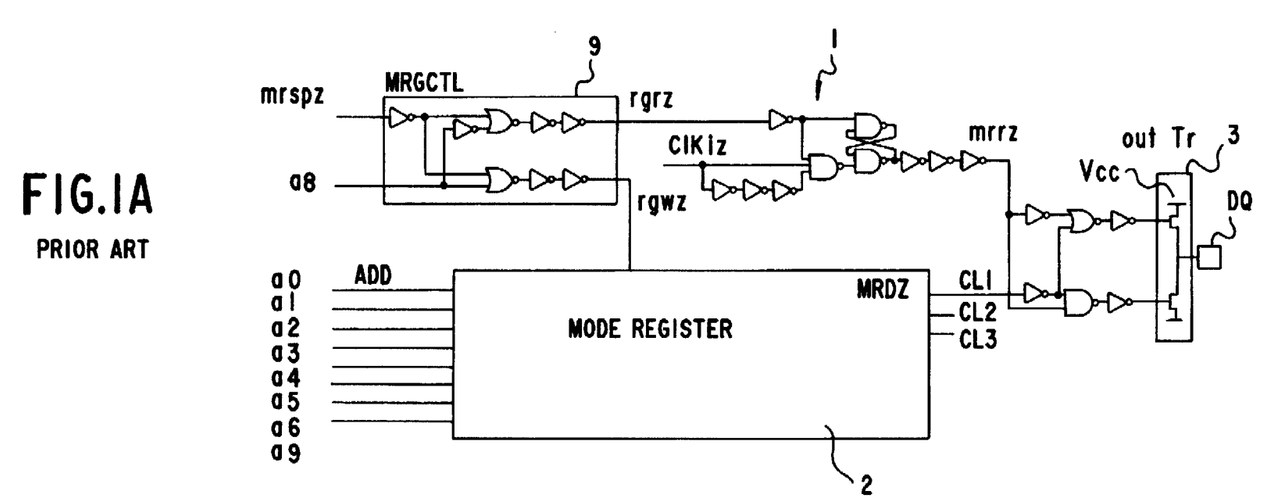
FIG. 1A is a circuit diagram showing a conventional mode register circuit and a mode register controlled by the same.

FIG. 1A is a circuit diagram showing a conventional mode register control circuit 9 and a mode register 2 controlled by the mode register control circuit 9.

A conventional mode register control circuit 9 may be built into an integrated SDRAM chip capable of high-speed outputting of data in response to an externally supplied high-speed clock.

The mode register control circuit 9 (indicated as MRGCTL in FIG. 1A) is provided in an SDRAM 1 so as to control operation of reading from the mode register 2 within the SDRAM 1, in synchronism with an external command (mrspz) and external address data (a0–a6, a8 and a9) fed via a terminal of the SDRAM 1.

The mode register 2 latches an operating mode of the SDRAM 1 in response to a mode register set command and a mode register read command, which are external commands.

The mode register read command causes an operating mode of the SDRAM 1 chip to be output via an output terminal DQ provided on the SDRAM 1 chip.

More specifically, the mode register read command causes a mode selection signal (indicated as MRDZ in FIG. 1A) to be output via an output transistor 3 (indicated as outTr in FIG. 1A) connected to the output terminal DQ.

A description will now be given, with reference to FIG. 1A, of an operation effected by external commands in the mode register control circuit 9.

The mode register control circuit 9 is constructed to be capable of executing the mode register read command whether the mode register control circuit 9 is in an idle state or an active state. Since a normal reading operation is conducted after the chip becomes active, data is not output in an idle state.

The mode register set command initiates an operating mode which controls the SDRAM 1 to be set to a desired operating mode by setting a CAS latency (CL) operating mode, a burst length (BL) operating mode and a burst type in the mode register 2.

Setting of an operating mode (an operating mode initiated by the mode register set command, or an operating mode initiated by the mode register set command) in the mode register control signal 9 is effected by raising an Operating mode signal (more specifically, CL1–CL3 signals) selected when the mode register set command is executed. More specifically, as shown in FIG. 1A, address data a0–a6, a8 and a9 input to the mode register 2 via an address input terminal ADD on the chip and specifying mode addresses are used to set the operating mode signal.

In the conventional mode register control circuit 9 as shown in FIG. 1A, the output transistor 3 (indicated as outTr in FIG. 1A) of the SDRAM 1 may be put in a low-impedance state when the mode register read command is input to the SDRAM 1 when the SDRAM 1 is turned on, or when it is determined that the mode register read command is latched in internal latching means in the SDRAM 1 (more specifically, an external command latching part or an external address latching part). The low-impedance state presents problems described later.

In the conventional control circuit, the mode register read command allows data to be output when the SDRAM 1 is idle. Hence, if it is determined that the data is output via the output terminal DQ according to the mode register read command, mode data inside the mode register can be read from the output transistor of the SDRAM 1.

A description will now be given, with reference to FIG. 1B, of how the mode register set command and the mode register read command are executed in the mode register control circuit 9.

Figure 1B:
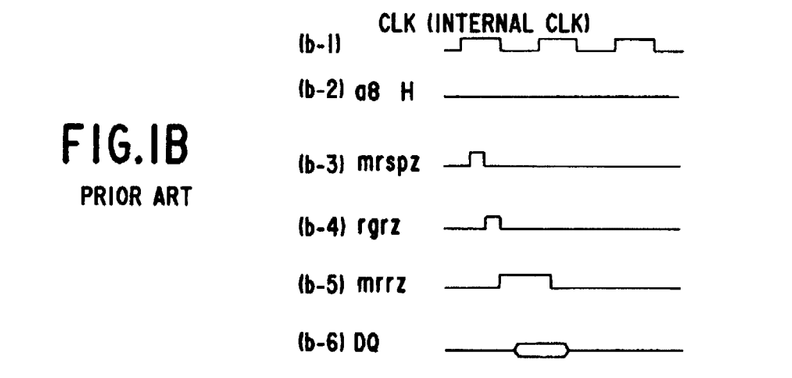
FIG. 1B is a timing chart which explains an operation of the circuit of FIG. 1A.

As shown in the timing chart of FIG. 1B, predetermined data (a0–a6, a8 and a9 shown in (b-2) of FIG. 1B) for selecting between the mode register set command and the mode register read command is input to the mode register 2 in synchronism with an internal clock of the SDRAM 1. The internal clock is a signal indicated as clkiz in (b-1) of FIG. 1B externally supplied via an external clock terminal CLK and an internal clock generating unit. A difference between the data setting for the mode register set command and that for the mode register read command is found only in a mode setting signal, that is, an a08 pin signal a8 supplied via the address input terminal ADD on the chip as address data specifying the mode address. When the a8 signal is L, the mode register set command is specified; when H, the mode register read command is specified.

Subsequently, the mode register control circuit 9 generates a register read signal (rgrz) (see (b-4) of FIG. 1B) which is a composite signal composed of the mode setting signal a8 and a mrspz signal (see (b-3) of FIG. 1B) which is generated in the external command latching part in the SDRAM 1 when the mode register set command or the mode register read command is latched, in synchronism with the external clock signal clkiz.

Subsequently, the mode register control circuit 9 generates a driving signal mrrz (see (b-5) of FIG. 1B) which is the register read signal latched. The driving signal mrrz is latched until the next external clock clkiz is generated. In response to the driving signal mrrz, the mode selection signal MRDZ stored in the mode register 2 is output (see (b-6) of FIG. 1B).

However, in the conventional mode register control circuit 9, if it is determined that data is output, when the SDRAM 1 is turned on, via the external output terminal DQ of the SDRAM 1 according to the mode register read command, or if it is determined that data is output in an idle state before the SDRAM 1 is turned on via the external output terminal DQ of the SDRAM 1 according to the mode register read command, the mode data inside the mode register is read from the output transistor of the SDRAM 1, causing the output transistor of the SDRAM 1 to be put in a low-impedance state. Therefore, the conventional mode register control circuit has a problem in that an abnormal current may flow when the SDRAM 1 is turned on or in an idle state occurring after the SDRAM 1 is turned on.

SUMMARY OF THE INVENTION

Accordingly, an object of the present invention is to provide a mode register control and a semiconductor integrated circuit having the same, in which the aforementioned problems are eliminated.

Another and more specific object of the present invention is to provide a mode register control circuit capable of preventing an abnormal current from flowing in the SDRAM when the SDRAM is turned on or in an idle state occurring after the SDRAM is turned on, by providing a control unit in the SDRAM (more specifically, in the mode register control circuit MRGCTL) for preventing the output transistor of the SDRAM from being in a low-impedance state even if it is determined that data is output, when the SDRAM is turned on, via an external output terminal of an SDRAM according to the mode register read command, or if it is determined that data is output in an idle state before the SDRAM is turned on via the external output terminal DQ of the SDRAM according to the mode register read command.

In order to achieve the aforementioned objects, the present invention provides a mode register control circuit provided in a semiconductor device and controlling operation of reading from a mode register of the semiconductor device in synchronism with an external command signal and an external clock signal, the mode register control circuit comprising a first control unit which uses internal means to disable, when the semiconductor device is turned on, execution a mode register read command, an external command, for specifying reading from the mode register so as to prevent reading from the mode register.

The first control unit may use internal means to disable, when the semiconductor device is turned on, execution of the mode register read command, using an initializing signal for specifying initialization of a latch part for latching an external command and/or an external address externally fed to the semiconductor device, the initialization being done during a transient state occurring after the semiconductor device is turned on.

By providing the first control unit, an abnormal current is prevented from flowing in an output transistor of the semiconductor device by preventing the mode register read command from being executed when the semiconductor device is turned on.

The aforementioned objects can also be achieved by a mode register control circuit provided in a semiconductor device and controlling operation of reading from a mode register of the semiconductor device in synchronism with an external command signal and an external clock signal, the mode register control circuit comprising a second control unit which instructs, upon determining that an external command detected when the semiconductor device is turned on is other than a mode register read command, an external command, specifying reading from the mode register, the mode register to execute the mode register read command even if a mode register set command, an external command, has not been executed after a power supply voltage becomes stable.

By providing the second control unit, the mode register read command is enabled on the condition that the mode register read command is executed after the semiconductor device is turned on, so that an abnormal current is prevented from flowing in the output transistor of the semiconductor device. In an idle state occurring after the semiconductor device is turned on, an abnormal current is prevented from flowing in the output transistor of the semiconductor device.

The aforementioned objects can also be achieved by a mode register control circuit provided in a semiconductor device and controlling operation of reading from a mode register of the semiconductor device in synchronism with an external command signal and an external clock signal, the mode register control circuit comprising a third control unit which instructs, upon detecting that a mode register set command, an external command, has been executed after the semiconductor is turned on, the mode register to execute a mode register read command, an external command, for specifying reading from the mode register.

By providing the second control unit, the mode register read command is enabled on the condition that the mode register set command is executed after the semiconductor device is turned on, so that an abnormal current is prevented from flowing in the output transistor of the semiconductor device. In an idle state occurring after the semiconductor device is turned on, an abnormal current is prevented from flowing in the output transistor of the semiconductor device.

The mode register control circuit may include the second control unit which instructs, upon determining that an external command detected when the semiconductor device is turned on is other than a mode register read command, an external command, specifying reading from the mode register, the mode register to execute the mode register read command even if a mode register set command, an external command, has not been executed after a power supply voltage becomes stable; and the third control unit which instructs, upon detecting that the mode register set command has been executed after the semiconductor is turned on, the mode register to execute the mode register read command.

The mode register control circuit may include the second control unit which instructs, upon determining that an external command detected when the semiconductor device is turned on is other than the mode register read command, the mode register to execute the mode register read command even if the mode register set command has not been executed after a power supply voltage becomes stable; and the third control unit which instructs, upon detecting that a mode register set command, an external command, has been executed after the semiconductor is turned on, the mode register to execute a mode register read command, an external command, for specifying reading from the mode register.

By providing the second control unit and the third control unit, an abnormal current is prevented from flowing in the output transistor of the semiconductor device, by disabling execution of the mode register read command when the semiconductor device is turned on. In the idle state occurring after the semiconductor device is turned on, an abnormal current is prevented from flowing in the output transistor of the semiconductor device, by ensuring that execution of the mode register read command is enabled on the condition that the mode register set command is executed.

The aforementioned objects of the present invention can also be achieved by a semiconductor device comprising:

a starter signal generating circuit for generating an initializing signal for initializing a latching circuit when the semiconductor device is turned on;

an internal clock generating unit for generating an internal clock signal in correspondence with an external clock signal;

a memory cell array;

a read/write circuit for reading data from and writing data to the memory cell array;

an input/output circuit for inputting and outputting data addresses and commands;

a mode register for latching an operation mode of the input/output circuit;

a mode register control circuit according to the present invention.

By providing the mode register control circuit of the present invention, an abnormal current is prevented from flowing in the output transistor of the semiconductor device, by disabling execution of the mode register read command when the semiconductor device is turned on. In the idle state occurring after the semiconductor device is turned on, an abnormal current is prevented from flowing in the output transistor of the semiconductor device, by ensuring that execution of the mode register read command is enabled on the condition that the mode register read command is executed.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

A description will now be given, with reference to the associated drawings, of a first and second embodiment of the present invention.

A mode register control circuit 10 according to the first and second embodiments of the present invention controls a semiconductor device 40 (SDRAM) capable of a data transfer speed higher than 100 Mbyte/sec.

A description will be given of a basic construction of an SDRAM 40.

Figure 2:
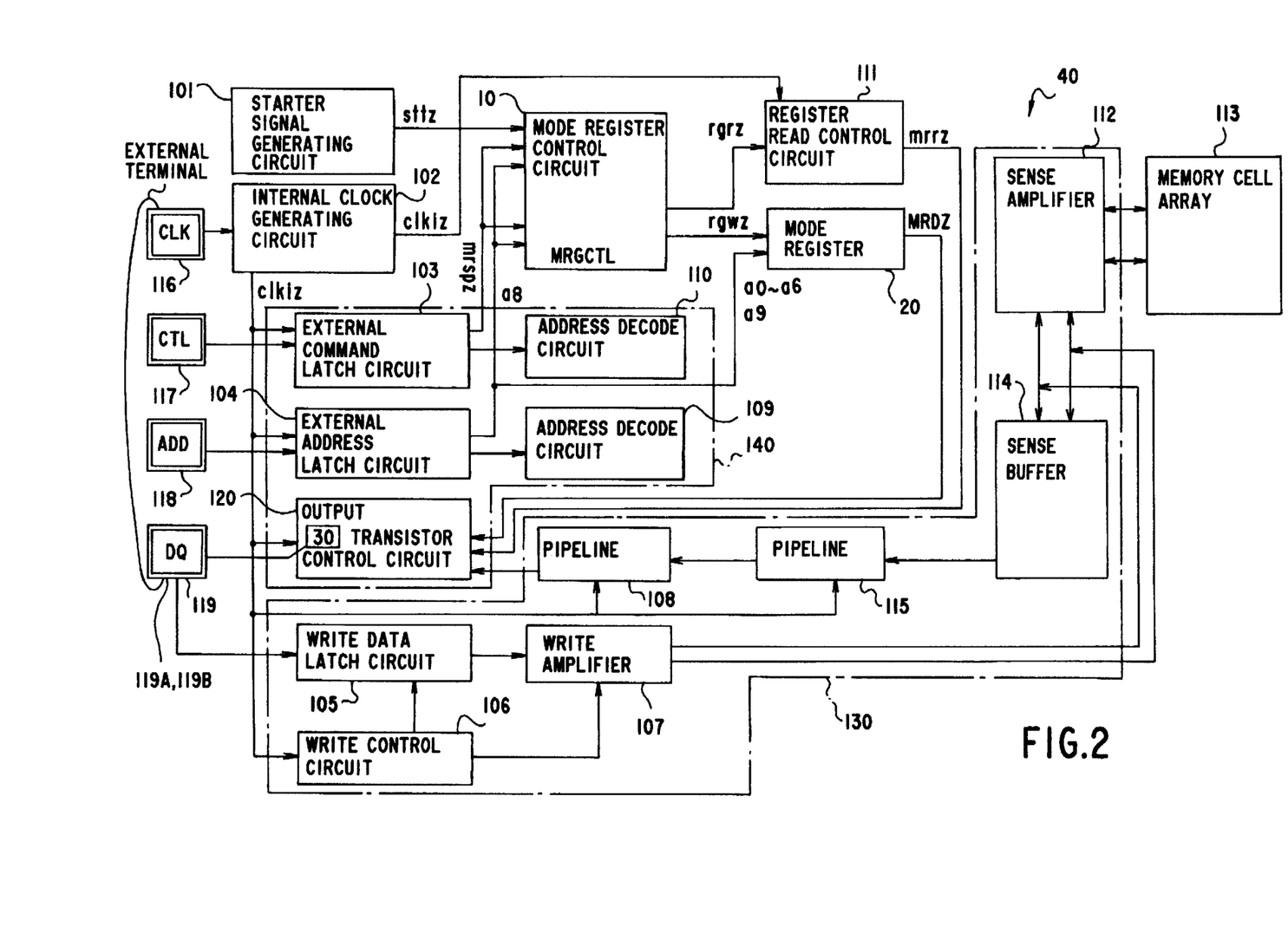
FIG. 2 is a circuit diagram showing a mode register control circuit of the present invention.

FIG. 2 is a block diagram showing the mode register control circuit 10.

An external clock signal clkiz is a signal input via an external clock terminal (CLK) 116 on the chip. An initializing signal sttz is a signal generated by a starter signal generating unit 101 on the chip so as to instruct latching circuits (specifically, an external command latching circuit 103 and an external address latching circuit 104) in the chip to be initialized when the SDRAM is turned on. A mrspz signal is generated by the external command latching circuit 103 in synchronization with the external clock signal clkiz, when the mode register set command or the mode register read command is fed via a command input terminal (CTL) 117 and latched in the external command latching circuit 103. A mode setting signal a8 is generated by the external address latching circuit 104 in correspondence with address data specifying mode address and input via the address input terminal (ADD) 118 on the chip.

The external clock terminal (CLK) 116, the command input terminal (CTL) 117, the address input terminal (ADD) 118 and an output terminal (DQ) 119 are external terminals provided on the SDRAM 40 chip.

The starter signal generating circuit 101 generates an initializing signal sttz for instructing latching circuits (more specifically, the external command latching circuit 103 and the external address latching circuit 104) to be initialized.

The internal clock generating circuit 102 generates a clock signal for internal use in accordance with the external clock signal clkiz supplied via the external clock terminal (CLK) 116.

The external address latching circuit 104 latches an external address signal (signal fed to the address input terminal (ADD) 118) in synchronism with the external clock signal clkiz supplied by the internal clock generating circuit 102. The external address signal is embodied by the address data a0-a6, a9 and the mode setting signal a8. An external address decoding circuit 109 generates a mode type out of the external address signal.

The external command latching circuit 103 latches an external command signal fed via the command input terminal (CTL) 117, that is, the mode register set command or the mode register read command, in synchronism with the external clock signal clkiz supplied from the internal clock generating circuit 102.

An external command decoding circuit 110 generates internal commands such as a mode register set command out of an external command signal.

The mode register control circuit 10 (indicated as MRGCTL in FIG. 2) executes the mode register set command or the mode register read command in accordance with the external address signal (a0-a6, a9), the mode setting signal (a8) and the mrspz signal. The mode register control circuit generates a register set signal rgwz for instructing a mode register 20 to be set and also generates, the register read signal rgrz for controlling the reading from the mode register.

A register read control circuit 111 generates, in accordance with a register read signal rgrz, a driving signal mrrz for instructing the output transistor control circuit 120 to drive an output transistor (outTr) 30.

The mode register 20 generates the mode selection signal (MRDZ) stored in the mode register 20, in accordance with the register read signal rgrz, the external address signal (a0-a6, a9).

The output transistor control circuit 120 controls the output transistor (outTr) 30 in accordance with the mode selection signal MRDZ.

A memory cell array 113 is constructed such that memory cells each storing data in units of a bit are formed into layers in a predetermined manner. The memory cell array 113 stores write data from a write amplifier circuit 107.

A sense amplifier 112 reads data stored in a memory cell of the memory cell array 113, temporarily stores the same, and transfers the same to a sense buffer 114. The sense amplifier 112 also temporarily stores the write data supplied by the write amplifier circuit 107 and stored in the sense buffer 114.

The sense buffer 114 temporarily stores data read by the sense amplifier 112 or the write data transferred by the write amplifier circuit 107.

A pipeline structure constructed of a pipeline 115 and a pipeline 108 one on top of the other executes a pipeline process for reading data stored in the sense buffer 114 in a parallel manner, in synchronism with an external clock signal clkiz.

A write data latching circuit 105 temporarily stores data input via an external input terminal (DQ) 119B.

The write amplifier circuit 107 writes the buffer latched in the write data latching circuit 105 in the sense buffer 114 in synchronism with the external clock signal clkiz.

A write control circuit 106 controls the latching action of the write data latching circuit 105 and the write operation of the write amplifier circuit 107, in synchronism with the external clock signal clkiz.

A description will now be given of modes of operation of the SDRAM 40.

The SDRAM 40 is capable of outputting data at a data transfer speed of higher than 100 Mbyte/sec, in synchronism with a high-speed clock supplied via the external clock terminal 116. In the SDRAM 40, two operating modes are available: the mode register set mode and the mode register read mode.

The mode register set command initiating the mode register set mode specifies the operating mode in which the SDRAM 40 is used. The mode register set command may set the CAS latency operating mode (CL), the burst length operating mode (BL) or the burst type in the mode register 2 in order to specify a specific operating mode.

Figure 3A:
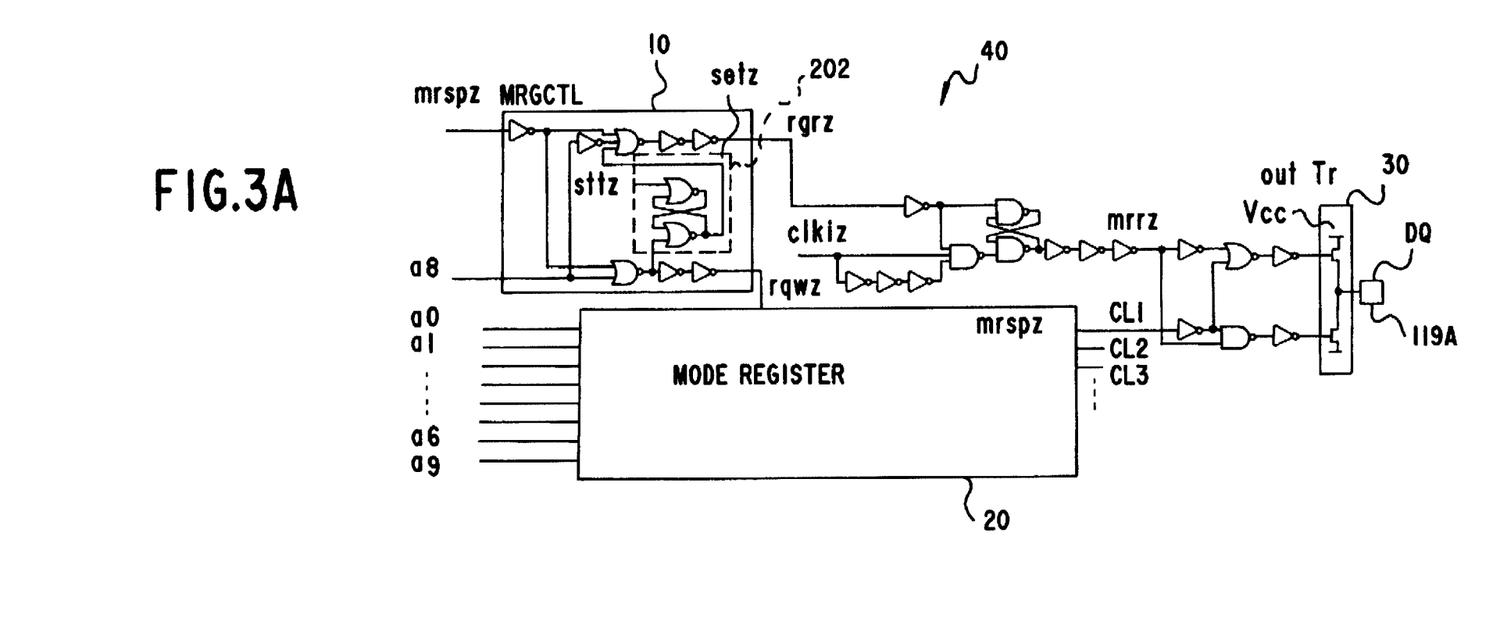
FIG. 3A is a circuit diagram showing a first embodiment of the present invention.
Figure 4A:
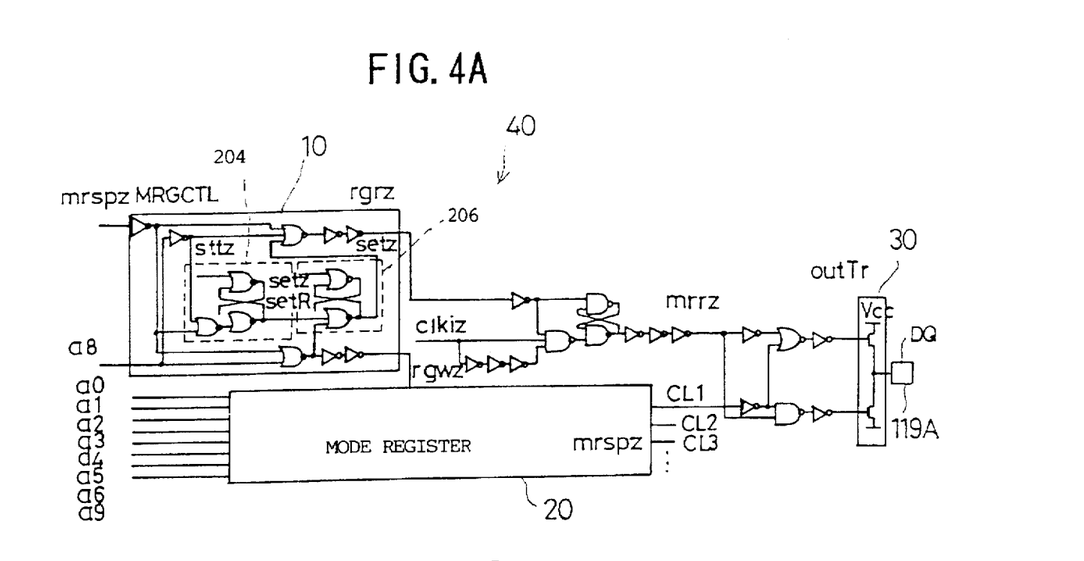
FIG. 4A is a circuit diagram showing a second embodiment of the present invention.

Setting of the operating mode is effected by raising the operating mode signal (specifically, CL1-CL3 signals) selected when the mode register set command is executed. Specifically, as shown in FIGS. 3A and 4A, predetermined data a0-a6 and a9 is input to the mode register 20 so that the operating mode is set. The mode register read command causes an operating mode of the SDRAM 40 chip to be output via a terminal DQ (an output terminal 119A or the output terminal 119B) provided on the SDRAM 40 chip. More specifically, the mode register read mode is such that the mode selection signal (MRDZ shown in FIGS. 3A and 4A) is output via the output transistor (outTr) 30 shown in FIGS. 3A and 4A and connected to the terminal DQ (the output terminal 119A or the input terminal 119B).

A description will now be given of the SDRAM 40.

When the SDRAM 40 receives the external clock signal clkiz generated by the internal clock generating circuit 102, or a signal supplied via the external clock terminal (CLK) 116 on the chip and the internal clock generating circuit 102, predetermined data (a0-a6, a8 and a9) for selection between the mode register set command and the mode register read command is input to the mode register 20 in synchronism with the reception. A difference between the data setting for the mode register set command and that for the mode register read command is found only in a mode setting signal, that is, an a08 pin signal a8 supplied via the address input terminal (ADD) 118 on the chip as address data specifying the mode address. When the a8 signal is L, the mode register set command is specified; when H, the mode register read command is specified.

Subsequently, the mode register control circuit 10 generates a register read signal rgrz which is a composite signal composed of the mode setting signal a8 and a mrspz signal which is generated in the external command latching circuit 103 in the SDRAM 40 when the mode register set command or the mode register read command is latched, in synchronism with the external clock signal clkiz.

Subsequently, the mode register control circuit 10 generates a driving signal mrrz which is the register read signal rgrz latched. The driving signal mrrz is latched until the next external clock clkiz is generated. In response to the driving signal mrrz, the mode selection signal MRDZ stored in the mode register 20 is output via the output transistor (outTr) 30.

A description will now be given of individual embodiments of the present invention.

Figure 3B:
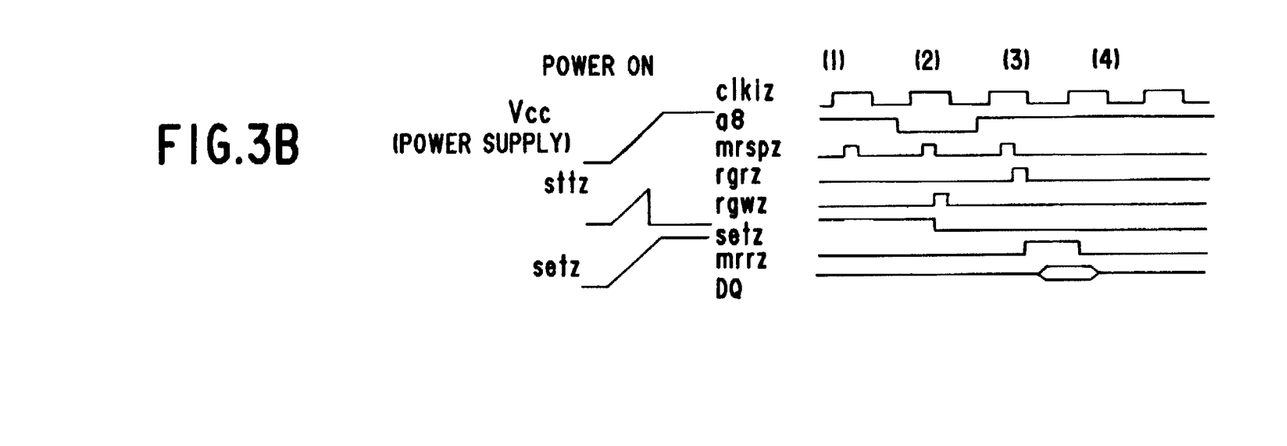
FIG. 3B is a timing chart which explains an operation of the first embodiment.

FIG. 3A is a circuit diagram showing a first embodiment of the present invention; and FIG. 3B is a timing chart which explains an operation according to the first embodiment.

The mode register control circuit (indicated as MRGCTL in FIG. 3A) 10 according to the first embodiment is semiconductor device provided in the SDRAM 40 so as to control operation of reading from the mode register within the SDRAM 40 in synchronism with the external command signal and the external clock signal. The mode register control circuit comprises a first control unit 202.

The first control unit 202 disables, when the SDRAM 40 is turned on, execution of the mode register read command so as to prevent the content of the mode register from being read. When the SDRAM 40 is turned on, the first control unit 202 uses an initializing signal sttz for instructing a transient state which occurs at power-on in the external command latching circuit 103 and the external address latching circuit 104 to be initialized, so that execution of the mode register read command is internally disabled.

A starter signal sttz is used to set logical elements like flip-flop circuits constituting the external command latching circuit 103 and the external address latching circuit 104 at a predetermined potential level (more specifically, at logical H or logical L) so as to put the elements out of an unstable state occurring after the power is on. A prohibiting signal setz generated by the first control unit 202 is set to logical H so as to prevent the mode register read command from being executed at the power-on. That is, no command for reading from the mode register 20 is output. In this way, the mode register read command is prevented by internal means from being executed when the SDRAM 40 is turned on, and the output transistor 30 is prevented from being in a low-impedance state.

The prohibiting signal setz generated by the first control unit 202 is set to logical L when the mode register read command is executed after the SDRAM 40 is turned on, so as to enable reading from the mode register.

More specifically, a signal similar to the register set signal rgwz output to set the mode register is used to reset the flip-flop circuits of the external command latching circuit 103 and the external address latching circuit 104 maintained at the predetermined potential by the starter signal sttz. In this way, the prohibiting signal setz is maintained at logical L.

Thus, the first control unit 202 enables execution of the mode register set command.

A description will now be given, with reference to FIG. 3B, of a specific operation according to the first embodiment.

In phase (1) shown in FIG. 3B, execution of the mode register read command is attempted. However, since the prohibiting signal setz generated by the first control unit 202 is at logical H, the register read signal rgrz generated by the mode register control circuit 10 is at logical L so that the output transistor 30 is maintained at a high-impedance state.

In phase (2) shown in FIG. 3B, the mode setting signal a8 is set to logical L in order for the mode register set command to be executed. Subsequently, the mode register control circuit 10 outputs the register set signal rgwz so as to set the mode register 20. At the same time, the prohibition signal setz generated by the first control unit 202 is latched at logical L so that the driving signal mrrz is generated. Thus, subsequent execution of the mode register read command is enabled.

In phase (3) shown in FIG. 3B, a bus that carries the register read signal rgrz generated by the mode register control circuit 10 is activated since the prohibition signal setz generated by the first control unit 202 is set at logical L as a result of the operation in phase (2). The mode setting signal a8 is set so that the mode register read command is executed. The mrspz signal in synchronism with the internal clock CLK is generated. The register read signal rgrz generated by the mode register control circuit 10 is output. Thus, the mode selection signal MRDZ which carries a content of the mode register 20 is output from the output transistor 30.

In phase (4) shown in FIG. 3B, the output transistor 30 is reset by the internal clock CLK to a high-impedance state so that the whole operation is completed.

As has been described, according to the mode register control circuit 10 provided with the first control unit 202, execution of the mode register read command is prevented when the SDRAM 40 is turned on. In this way, an abnormal current is prevented from flowing in the output transistor 30 of the SDRAM 40.

A description will now be given of the SDRAM 40 according to the first embodiment.

The SDRAM 40 comprises the mode register control circuit 10, the starter signal generating circuit 101 for generating an initializing signal sttz for instructing latching circuits to be initialized at power-on, the internal clock generating unit 102 for generating an internal clock clkiz in accordance with the external clock, the memory cell array 113, a read/write circuit 130 responsible for reading data from the memory cell 113 and writing data into the same, an input/output circuit 140 responsible for inputting and outputting data addresses and commands, the mode register 20 storing the operating mode of the input/output circuit, and the register read control circuit 111 for controlling reading from the mode register in synchronism with the external clock.

The read/write circuit 130 comprises the write data latching circuit 105, the write control circuit 106, the write amplifier circuit 107, the pipeline 108, the sense amplifier 112, the sense buffer 114, and the pipeline 115 which are described above.

The input/output circuit 140 comprises the external command latching circuit 103, the external address latching circuit 104, the external address decoding circuit 109, the external command decoding circuit 110, and the output transistor control circuit 120.

According to the SDRAM 40 provided with the mode register control circuit 10, it is possible to prevent an abnormal current from flowing in the output transistor (outTr) 30 by prohibiting execution of the mode register read command when the SDRAM 40 is turned on. In the idle state occurring after the SDRAM 40 is turned on, it is ensured that execution of the mode register read command is enabled on the condition that the mode register set command is executed so that an abnormal current is prevented from flowing in the output transistor (outTr) 30.

A description will now be given of a second embodiment.

Figure 4B:
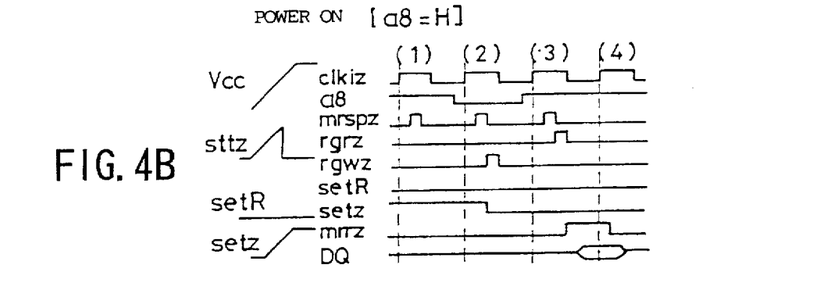
FIGS. 4B and 4C are timing charts which explain an operation of the second embodiment.
Figure 4C:
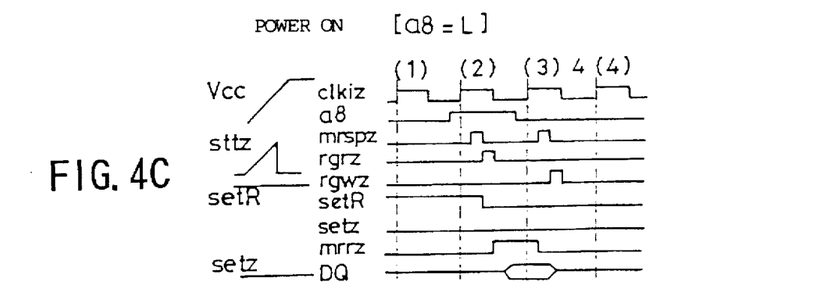

FIG. 4A is a circuit diagram showing the second embodiment, and FIGS. 4B and 4C are timing charts which explain the operation according to the second embodiment.

The mode register control circuit 10 (indicated as MRGCTL in FIG. 4A) according to the second embodiment comprises a second control unit 204 and a third control circuit 106, as shown in FIG. 4A.

Upon detecting that the external command detected when the SDRAM 40 is turned on is other than the mode register read command, the second control unit 204 instructs the mode register to execute the mode register read command even if the mode register set signal has not been executed after the power supply voltage is stabilized.

The third control circuit 106 instructs the mode register to execute the mode register read command when it is determined that the mode register set command is executed after the SDRAM 40 is turned on.

Since the mode register control circuit 10 according to the second embodiment is provided with the second control unit 204 and the third control circuit 206, its added advantage over the mode register control circuit 10 according to the first embodiment is that the operating mode type of the external command, latched in the mode register 20, other than the mode register set command can be read. Even if the mode register set command is not executed, the mode register read command can be executed on the condition that an external command other than the mode register set command is executed after power-on. In this way, a normal internal operation can be effected.

A description will now be given, with reference to FIG. 4B, of a specific operation according to the second embodiment executed when it is determined that the mode register read command is specified, that is, it is determined that a8=H.

In phase (1) shown in FIG. 4B, the mrspz signal and the mrsqz signal in synchronism with the internal clock CLK, and the mode setting signal a8 are set to logical H, so that the second control unit 204 sets a set signal setR to logical L. The set signal setR set to logical L by the second control unit 204 is maintained at logical L after power-on.

In phase (2) shown in FIG. 4B, the third control circuit 206 latches the prohibiting signal setz to logical H, in response to the starter signal sttz and the set signal setR set to logical L by the second control unit 204. As a result, the output transistor 30 is prevented from being put in a low-impedance state at power-on and an abnormal current is prevented from flowing.

In phase (3) shown in FIG. 4B, when the mode register set command is executed, the mode register control circuit 10 outputs the register set signal rgwz. At the same time as the mode register 20 is set, the prohibiting signal setz generated by the third control circuit 206 is latched at logical L so that the driving signal mrrz is generated. Subsequently, execution of the mode register read command is enabled.

In phase (4) shown in FIG. 4B, the prohibiting signal setz is set by the third control circuit 206 at logical L as a result of the operation in phase (3). Therefore, the bus carrying the register read signal rgrz generated by the mode register control circuit 10 is activated. Further, the mode setting signal a8 is set to logical H to enable execution of the mode register read command, the mrspz signal in synchronism with the internal clock CLK is generated, and the register read signal rgrz is generated and output by the mode register control circuit 10. As a result, the mode selection signal MRDZ stored in the mode register 20 is output via the output transistor 30.

A description will now be given, with reference to FIG. 4C, of a specific operation according to the second embodiment executed when it is determined that the mode register read command is not specified, that is, a8=L.

In phase (1) shown in FIG. 4C, the mrsqz signal or the mode setting signal a8 is set to logical L, so that the second control unit 204 sets the set signal setR to logical H. The set signal setR set to logical H by the second control unit 204 is maintained at logical H after power-on.

In phase (2) shown in FIG. 4C, the third control circuit 206 latches the prohibiting signal setz to logical L. As a result, it is determined that the mode register read command is not specified. Thus, the output transistor 30 is prevented from being put in a low-impedance state.

In phase (3) shown in FIG. 4C, the prohibiting signal setz generated by the third control circuit 206 is latched at logical L so that execution of the mode register read command is enabled and the content of the register can be read at power-on.

As has been described, according to the mode register control circuit 10 provided with the second control unit 204 and the third control unit 206, execution of the mode register read command is disabled when the SDRAM 40 is turned on. By maintaining the output transistor 30 in a high-impedance state, an abnormal current is prevented from flowing into the output transistor 30 of the SDRAM 40.

In an idle state occurring after power-on, execution of the mode register read command is enabled subsequent to at least one execution of the mode register read command. Thus, an abnormal current is prevented from flowing in the output transistor 30 of the SDRAM 40.

A description will now be given of the SDRAM 40 according to the second embodiment.

As shown in FIG. 2, the SDRAM 40 comprises the mode register control circuit 10, the starter signal generating circuit 101 for generating an initializing signal sttz for instructing latching circuits to be initialized at power-on, the internal clock generating unit 102 for generating an internal clock clkiz in accordance with the external clock, the memory cell array 113, the read/write circuit 130 responsible for reading data from the memory cell 113 and writing data into the same, the input/output circuit 140 responsible for inputting and outputting data addresses and commands, the mode register 20 storing the operating mode of the input/output circuit, and the register read control circuit 111 for controlling reading from the mode register in synchronism with the external clock.

The read/write circuit 130 comprises the write data latching circuit 105, the write control circuit 106, the write amplifier circuit 107, the pipeline 108, the sense amplifier 112, the sense buffer 114, and the pipeline 115 which are described above.

The input/output circuit 140 comprises the external command latching circuit 103, the external address latching circuit 104, the external address decoding circuit 109, the external command decoding circuit 110, and the output transistor control circuit 120.

According to the SDRAM 40 provided with the mode register control circuit 10, it is possible to prevent an abnormal current from flowing in the output transistor (outTr) 30 by prohibiting execution of the mode register read command when the SDRAM 40 is turned on. In the idle state occurring after the SDRAM 40 is turned on, it is ensured that execution of the mode register read command is enabled on the condition that the mode register read command is executed so that an abnormal current is prevented from flowing in the output transistor (outTr) 30.

The present invention is not limited to the above described embodiments, and variations and modifications may be made without departing from the scope of the present invention.

What is claimed is:

1. A mode register control circuit provided in a semiconductor device and controlling operation of reading from a mode register of the semiconductor device in response to an external command signal, said mode register control circuit comprising a first control unit for preventing reading out a content of the mode register from the semiconductor device, when the semiconductor device beings to be supplied with power.

2. The mode register control circuit as claimed in claim 1, wherein a content of the mode register is prevented from being read out by using an initializing signal for initializing a latch part for latching an external command and/or an external address externally fed to the semiconductor device when said latch part is supplied with power.

3. A mode register control circuit provided in a semiconductor device and controlling operation of reading from a mode register of the semiconductor device in response to an external command signal, said mode register control circuit comprising a second control unit which instructs, upon determining that a command other than a mode register read command instructing a content of the mode register to be read out is detected when the semiconductor device is supplied with power, the mode register to execute the mode register read command even if a mode register set command has not been executed after a power supply voltage becomes stable.

4. A mode register control circuit provided in a semiconductor device and controlling operation of reading from a mode register of the semiconductor device in response to an external command signal, said mode register control circuit comprising a third control unit which instructs, upon detecting that a mode register set command has been executed after the semiconductor is supplied with power, the mode register to execute a mode register read command instructing a content of the mode register to be read out.

5. The mode register control circuit as claimed in claim 3, comprising a third control unit which instructs, upon detecting that the mode register set command has been executed after the semiconductor is supplied with power, the mode register to execute the mode register read command.

6. The mode register control circuit as claimed in claim 4, comprising a second control unit which instructs, upon determining that a command other than the mode register read command is detected when the semiconductor device is supplied with power, the mode register to execute the mode register read command even if the mode register set command has not been executed after a power supply voltage becomes stable.

\* \* \* \* \*